United States Patent
Higuchi et al.

(10) Patent No.: US 11,881,403 B2
(45) Date of Patent: Jan. 23, 2024

(54) SUBSTRATE PROCESSING METHOD AND SUBSTRATE PROCESSING APPARATUS

(71) Applicant: SCREEN Holdings Co., Ltd., Kyoto (JP)

(72) Inventors: Ayumi Higuchi, Kyoto (JP); Yuya Akanishi, Kyoto (JP)

(73) Assignee: SCREEN HOLDINGS CO., LTD.

(*) Notice: Subject to any disclaimer, the term of this patent is extended or adjusted under 35 U.S.C. 154(b) by 238 days.

(21) Appl. No.: 17/439,445

(22) PCT Filed: Jan. 8, 2020

(86) PCT No.: PCT/JP2020/000321
§ 371 (c)(1),
(2) Date: Sep. 15, 2021

(87) PCT Pub. No.: WO2020/188958
PCT Pub. Date: Sep. 24, 2020

(65) Prior Publication Data
US 2022/0189773 A1 Jun. 16, 2022

(30) Foreign Application Priority Data
Mar. 20, 2019 (JP) ................. 2019-053164

(51) Int. Cl.
*H01L 21/033* (2006.01)
*H01L 21/268* (2006.01)
(Continued)

(52) U.S. Cl.
CPC ...... *H01L 21/0337* (2013.01); *H01L 21/2686* (2013.01); *H01L 21/3065* (2013.01); *H01L 21/6708* (2013.01)

(58) Field of Classification Search
None
See application file for complete search history.

(56) References Cited

U.S. PATENT DOCUMENTS

| 9,991,129 B1* | 6/2018 | Bajaj ................. H01L 21/32132 |
| 2004/0038438 A1 | 2/2004 | Shih et al. ...................... 438/30 |

(Continued)

FOREIGN PATENT DOCUMENTS

| JP | H04-180624 A | 6/1992 |
| JP | H07-283198 A | 10/1995 |

(Continued)

OTHER PUBLICATIONS

PCT/IB/326—Notification Concerning Transmittal of International Preliminary Report on Patentability including PCT/IB/373 and PCT/ISA/237 (in Japanese).

(Continued)

*Primary Examiner* — Roberts P Culbert
(74) *Attorney, Agent, or Firm* — OSTROLENK FABER LLP

(57) ABSTRACT

A substrate processing method includes an operation for holding a substrate in a horizontal position, the substrate including an amorphous silicon layer having a surface on which an altered layer derived from dry etching is formed, an operation for irradiating the altered layer with ultraviolet rays to reform the altered layer into a reformed layer, and an operation for supplying a chemical solution to the amorphous silicon layer having the reformed layer on the surface to perform wet etching on the amorphous silicon layer. This improves the efficiency of the wet etching on the amorphous silicon layer.

9 Claims, 6 Drawing Sheets

(51) Int. Cl.
  *H01L 21/3065* (2006.01)
  *H01L 21/67* (2006.01)

(56) References Cited

U.S. PATENT DOCUMENTS

| | | | |
|---|---|---|---|
| 2004/0209194 A1* | 10/2004 | Kume | H01L 21/0206 430/394 |
| 2010/0043820 A1 | 2/2010 | Kawamura et al. | 134/1.1 |
| 2015/0079790 A1 | 3/2015 | Nishimura et al. | 438/696 |
| 2017/0294323 A1 | 10/2017 | Miura et al. | |
| 2018/0342385 A1 | 11/2018 | Tonegawa | |
| 2020/0141415 A1 | 5/2020 | Tamai et al. | |

FOREIGN PATENT DOCUMENTS

| | | |
|---|---|---|
| JP | H08-078352 A | 3/1996 |
| JP | 2001-085387 A | 3/2001 |
| JP | 2002-093740 A | 3/2002 |
| JP | 2011-192764 A | 9/2011 |
| JP | 2013/110139 A | 6/2013 |
| JP | 2018-019089 A | 2/2018 |
| JP | 2018/198288 A | 12/2018 |
| TW | 200403512 A | 3/2004 |
| TW | 200832535 A | 8/2008 |
| WO | WO 2018/198288 A1 | 11/2018 |

OTHER PUBLICATIONS

PCT/IB/338—Notification of Transmittal of Translation of the International Preliminary Report on Patentability including PCT/IB/373 and PCT/ISA/237 (in English).
International Search Report dated Mar. 17, 2020 in corresponding PCT International Application No. PCT/JP2020/000321.
Written Opinion dated Mar. 17, 2020 in corresponding PCT International Application No. PCT/JP2020/000321.
Decision to Grant dated Jul. 21, 2022 for corresponding Japanese Application No. 2019-053164 and English translation.

* cited by examiner

SUBSTRATE PROCESSING METHOD AND SUBSTRATE PROCESSING APPARATUS

CROSS-REFERENCE TO RELATED APPLICATIONS

The present application is a 35 U.S.C. §§ 371 national phase conversion of International Application No. PCT/JP2020/000321, filed Jan. 8, 2020, which claims priority to Japanese Patent Application No. 2019-053164, filed Mar. 20, 2019, the contents of both of which are incorporated herein by reference. The PCT International Application was published in the Japanese language.

TECHNICAL FIELD

The present invention relates to a substrate processing method and a substrate processing apparatus.

BACKGROUND ART

As semiconductor substrates (hereinafter, simply referred to as "substrates") have finer patterns in recent years, multiple patterning is used for pattern formation. The multiple patterning involves covering the upper and side faces of an intermediate pattern formed of amorphous silicon or other materials on a substrate with a coating film such as silicon oxide (SiOx) and removing the coating film from the upper face of the intermediate pattern by plasma etching. Then, the intermediate pattern is removed by dry etching. This causes the coating film that covers the side faces of the intermediate pattern (so-called sidewalls) to be left as a pattern finer than the intermediate pattern. Thereafter, dry etching is performed using the sidewalls as masks to complete the fine pattern.

On the other hand, Japanese Patent Application Laid-Open No. 2018-19089 (Document 1) discloses a technique for supplying a chemical solution containing tetraethyl ammonium hydroxide (TMAH) to a polysilicon film on a substrate to perform wet etching on the polysilicon film.

In the aforementioned multiple patterning, when the intermediate pattern is removed by dry etching, polymer residues may remain between the sidewalls and cause a failure in pattern formation in downstream steps such as film deposition and etching. Therefore, consideration is being given to supplying a chemical solution to the surface of the substrate to remove the intermediate pattern of amorphous silicon by wet etching However, it has been found that, if the intermediate pattern of amorphous silicon is to be removed by wet etching, the etch rate becomes considerably lower than the etch rate of wet etching performed on ordinary amorphous silicon.

In view of this, the inventors of the present invention have conducted diligent studies and found out that the aforementioned decrease in etch rate is caused as a result of alternation of the upper face of the intermediate pattern of amorphous silicon (i.e., amorphous silicon layer) during plasma etching, which is an upstream operation performed before the removal of the intermediate pattern, the alteration being caused by the introduction of elements such as oxygen or carbon into the upper face of the intermediate pattern exposed at the coating film of silicon oxide or other materials.

SUMMARY OF INVENTION

The present invention is intended for a substrate processing method, and it is an object of the present invention to efficiently perform wet etching on an amorphous silicon layer.

A substrate processing method according to a preferable embodiment of the present invention includes a) holding a substrate in a horizontal position, the substrate including an amorphous silicon layer having a surface on which an altered layer derived from dry etching is formed, b) irradiating the altered layer with an ultraviolet ray to reform the altered layer into a reformed layer, and c) supplying a chemical solution to the amorphous silicon layer having the reformed layer on the surface to perform wet etching on the amorphous silicon layer. This enables efficiently performing the wet etching on the amorphous silicon layer.

Preferably, the dry etching includes etching a coating film formed on the surface of the amorphous silicon layer, using plasma generated from a fluorocarbon gas and an oxygen gas.

Preferably, the amorphous silicon layer is an intermediate pattern formed in a course of multiple patterning of the substrate, the dry etching includes anisotropically etching the coating film that covers upper and side faces of the intermediate pattern to expose the upper face of the intermediate pattern from the coating film and to form a sidewall of the coating film that covers the side face of the intermediate pattern, and the wet etching removes the intermediate pattern while leaving the sidewall.

Preferably, the ultraviolet ray has a wavelength shorter than or equal to 250 nm.

Preferably, in the operation b), a cumulative amount of irradiation with the ultraviolet ray is greater than or equal to 1000 mJ/cm$^2$.

Preferably, the irradiation with the ultraviolet ray in the operation b) is conducted in a low oxygen atmosphere.

Preferably, the operation b) includes scanning a region of the surface of the substrate that is irradiated with the ultraviolet ray, and in the amorphous silicon layer, a region where the altered layer has a large thickness has a greater cumulative amount of irradiation with the ultraviolet ray than a region where the altered layer has a small thickness.

Preferably, the operation c) includes scanning a position of ejection of the chemical solution on the substrate, and in the amorphous silicon layer, a region where the reformed layer has a large thickness has a longer time of ejection of the chemical solution than a region where the reformed layer has a small thickness.

Preferably, the substrate processing method described above further includes, between the operation b) and the operation c), supplying another chemical solution to the amorphous silicon layer to remove a surface natural oxide film from the amorphous silicon layer.

The present invention is also intended for a substrate processing apparatus. A substrate processing apparatus according to a preferable embodiment of the present invention includes a substrate holder that holds a substrate in a horizontal position, the substrate including an amorphous silicon layer having a surface on which an altered layer derived from dry etching is formed, an ultraviolet irradiator that irradiates the altered layer with an ultraviolet ray to reform the altered layer into a reformed layer, and a chemical-solution supply part that supplies a chemical solution to the amorphous silicon layer having the reformed layer on the surface to perform wet etching on the amorphous silicon layer. This enables efficiently performing the wet etching on the amorphous silicon layer.

Preferably, the dry etching includes etching a coating film formed on the surface of the amorphous silicon layer, using plasma generated from a fluorocarbon gas and an oxygen gas.

Preferably, the amorphous silicon layer is an intermediate pattern formed in a course of multiple patterning of the substrate, the dry etching includes anisotropically etching the coating film that covers upper and side faces of the intermediate pattern to expose the upper face of the intermediate pattern from the coating film and to form a sidewall of the coating film that covers the side face of the intermediate pattern, and the wet etching removes the intermediate pattern while leaving the sidewall.

Preferably, the ultraviolet ray has a wavelength shorter than or equal to 250 nm.

Preferably, a cumulative amount of irradiation with the ultraviolet ray applied to the amorphous silicon layer is greater than or equal to 1000 mJ/cm$^2$.

Preferably, the irradiation of the amorphous silicon layer with the ultraviolet ray is conducted in a low oxygen atmosphere.

Preferably, the substrate processing apparatus described above further includes an irradiation controller that controls the ultraviolet irradiator. The ultraviolet irradiator includes an ultraviolet lamp that irradiates the substrate with the ultraviolet ray, and an irradiation-region scanner that scans a region of the surface of the substrate that is irradiated with the ultraviolet ray. The irradiation controller controls at least one of the ultraviolet lamp and the irradiation-region scanner such that, in the amorphous silicon layer, a region where the altered layer has a large thickness has a greater cumulative amount of irradiation with the ultraviolet ray than a region where the altered layer has a small thickness.

Preferably, the substrate processing apparatus described above further includes a supply controller that controls the chemical-solution supply part. The chemical-solution supply part includes a chemical-solution ejector that ejects the chemical solution to the substrate, and an ejection-position scanner that scans a position of ejection of the chemical solution on the substrate. The supply controller controls the ejection-position scanner such that, in the amorphous silicon layer, a region where the reformed layer has a large thickness has a longer time of ejection of the chemical solution than a region where the reformed layer has a small thickness.

Preferably, the substrate processing apparatus described above further includes another chemical-solution supply part that, at a time between the irradiation of the amorphous silicon layer with the ultraviolet ray and the supply of the chemical solution, supplies another chemical solution to the amorphous silicon layer to remove a surface natural oxide film from the amorphous silicon layer.

These and other objects, features, aspects and advantages of the present invention will become more apparent from the following detailed description of the present invention when taken in conjunction with the accompanying drawings.

DESCRIPTION OF EMBODIMENTS

Figure 1:
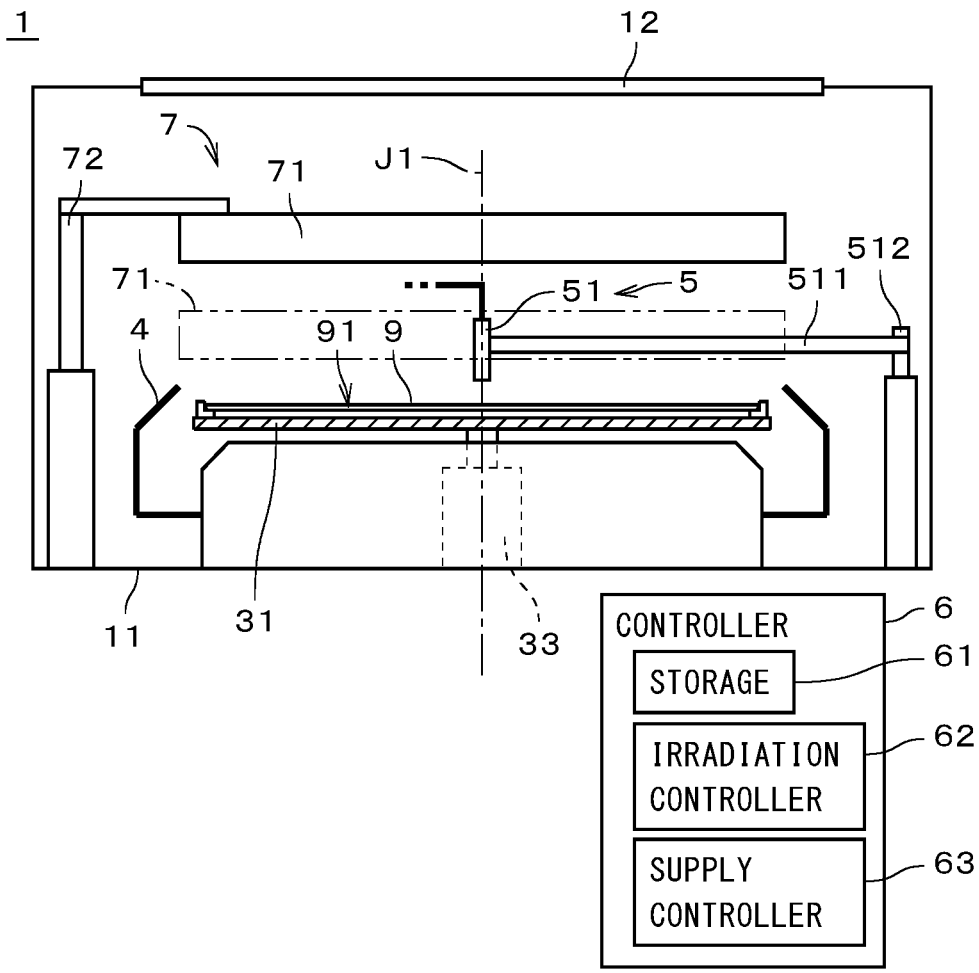
FIG. 1 is a side view of a substrate processing apparatus according to a first embodiment.

FIG. 1 is a side view illustrating a configuration of a substrate processing apparatus 1 according to a first embodiment of the present invention. The substrate processing apparatus 1 is a single wafer processing apparatus that processes semiconductor substrates 9 (hereinafter, simply referred to as "substrates 9") one at a time. The substrate processing apparatus 1 performs processing by supplying processing liquids to a substrate 9. In FIG. 1, part of the configuration of the substrate processing apparatus 1 is illustrated in cross section.

The substrate processing apparatus 1 includes a substrate holder 31, a substrate rotation mechanism 33, a cup part 4, a processing-liquid supply part 5, a controller 6, an ultraviolet irradiator 7, and a housing 11. The substrate holder 31, the substrate rotation mechanism 33, the cup part 4, the ultraviolet irradiator 7, and other constituent elements are housed in an internal space of the housing 11. In FIG. 1, the housing 11 is illustrated in cross section (the same applies to FIG. 10). The housing 11 has a canopy provided with an airflow generator 12 that generates a downstream airflow (so-called downflow) by supplying a gas to the internal space. The airflow generator 12 may, for example, be a fan filter unit (FFU).

The controller 6 is arranged outside the housing 11 and controls constituent elements such as the substrate holder 31, the substrate rotation mechanism 33, the processing-liquid supply part 5, and the ultraviolet irradiator 7. The controller 6 includes, for example, an ordinary computer that includes a processor, a memory, an input/output part, and a bus. The bus is a signal circuit that connects the processor, the memory, and the input/output part. The memory stores programs and various types of information. The processor executes various types of processing (e.g., numerical calculation) while using the memory, in accordance with programs and other information stored in the memory. The input/output part includes a keyboard and a mouse that receive input from an operator, a display that displays outputs or the like of the processor, and a transmitter that transmits the outputs or the like of the processor.

The controller 6 includes a storage 61, an irradiation controller 62, and a supply controller 63. The storage 61 is realized primarily by the memory and stores various types of information such as a recipe for processing the substrate 9. The irradiation controller 62 is primarily realized by the processor and controls constituent elements such as the ultraviolet irradiator 7 in accordance with a recipe for processing or other information stored in the storage 61. The supply controller 63 is primarily realized by the processor and controls constituent elements such as the processing-liquid supply part 5 in accordance with a recipe for processing and other information stored in the storage 61.

The substrate holder 31 faces a main surface on the lower side (i.e., lower face) of the substrate 9 held in a horizontal position and holds the substrate 9 from the underside. The substrate holder 31 may, for example, be a mechanical chuck that mechanically supports the substrate 9. The substrate holder 31 is provided rotatable about a central axis J1 extending in the up-down direction.

The substrate holder 31 includes a holder main body and a plurality of chuck pins. The holder main body is a generally disk-shaped member that faces the lower face of the substrate 9. The chuck pins are arranged at generally equiangular intervals in a circumferential direction about the central axis J1 (hereinafter, also simply referred to as a "circumferential direction") at the peripheral edge of the holder main body. Each chuck pin protrudes upward from the upper face of the holder main body and supports the substrate 9 in contact with the side face of the substrate 9 and a peripheral edge region of the lower face of the substrate 9. Note that the substrate holder 31 may also be a vacuum chuck or any other member that adsorbs and holds a central portion of the lower face of the substrate 9.

The substrate rotation mechanism 33 is arranged under the substrate holder 31. The substrate rotation mechanism 33 rotates the substrate 9 together with the substrate holder 31 about the central axis J1. For example, the substrate rotation mechanism 33 includes an electrically rotating motor having a rotation shaft connected to the holder main body of the substrate holder 31. The substrate rotation mechanism 33 may have any other structure such as a hollow motor.

The processing-liquid supply part 5 supplies a plurality of types of processing liquids individually to the substrate 9. These types of processing liquids include, for example, a chemical solution and a rinsing liquid, which will be described later. The processing-liquid supply part 5 includes a nozzle 51, an arm 511, and a nozzle rotation mechanism 512. The nozzle 51 supplies the processing liquids toward a main surface on the upper side (hereinafter, referred to as an "upper face 91") of the substrate 9 from above the substrate 9. The nozzle 51 is formed of, for example, a resin having high chemical resistance such as Teflon (registered trademark).

The arm 511 is a rod-like member that extends in a generally horizontal direction and supports the nozzle 51. The nozzle rotation mechanism 512 is arranged outside the cup part 4 in a radial direction about the central axis J1 (hereinafter, also simply referred to as a "radial direction"). The nozzle rotation mechanism 512 includes, for example, an electrically rotating motor having a rotation shaft extending in the up-down direction. The rotation shaft is connected to one end of the arm 511. The nozzle rotation mechanism 512 rotates the arm 511 about the rotation shaft extending in the up-down direction so as to move the nozzle 51 in the horizontal direction from above the substrate 9 to its retracted position located radially outward of the cup part 4.

The cup part 4 is an annular member about the central axis J1. The cup part 4 is arranged all around the substrate 9 and the substrate holder 31 and covers the sides and bottoms of the substrate 9 and the substrate holder 31. The cup part 4 is a liquid receiver that receives liquids such as the processing liquids scattered from the rotating substrate 9 toward its surrounding environments. The cup part 4 has an inner side face formed of, for example, a water-repellent material. Irrespective of whether the substrate 9 is being rotated or is stationary, the cup part 4 is stationary in the circumferential direction. The cup part 4 has a bottom provided with a drain port (not shown) for discharging the processing liquids or other liquids received by the cup part 4 to the outside of the housing 11. The cup part 4 is movable in the up-down direction by an elevating mechanism (not shown) between its processing position that is a position located around the substrate 9 illustrated in FIG. 1 and its retracted position located below the processing position.

Unlike a single-layer structure illustrated in FIG. 1, the cup part 4 may have a stacked structure including a plurality of cups stacked in the radial direction. When the cup part 4 has a stacked structure, these cups are individually movable in the up-down direction and used to receive the processing liquids scattered from the substrate 9 by switching according to the type of the processing liquids.

Figure 2:
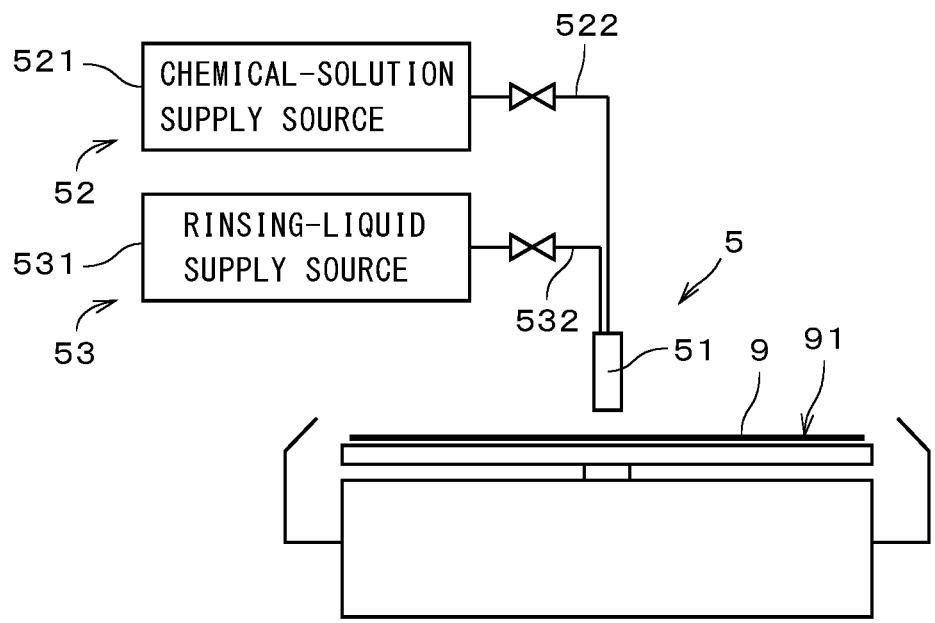
FIG. 2 is a block diagram illustrating a processing-liquid supply part.

FIG. 2 is a block diagram illustrating the processing-liquid supply part 5 of the substrate processing apparatus 1. The configuration other than the processing-liquid supply part 5 is also illustrated in FIG. 2. The processing-liquid supply part 5 includes a chemical-solution supply part 52 and a rinsing-liquid supply part 53. The chemical-solution supply part 52 includes the nozzle 51, the arm 511 (see FIG. 1), a nozzle rotation mechanism 512 (see FIG. 1), a chemical-solution supply source 521, and a chemical solution duct 522. The nozzle 51 is connected to the chemical-solution supply source 521 via the chemical solution duct 522. The nozzle 51 serves as a chemical-solution ejector for ejecting a chemical solution sent out from the chemical-solution supply source 521 toward the upper face 91 of the substrate 9. The chemical solution is an etchant used for the wet etching of the substrate 9. This etchant may, for example, be an alkali etchant such as an ammonium hydroxide ($NH_4OH$) aqueous solution.

The rinsing-liquid supply part 53 includes the aforementioned nozzle 51, the arm 511, a nozzle rotation mechanism 512, a rinsing-liquid supply source 531, and a rinsing liquid duct 532. The nozzle 51 is connected to the rinsing-liquid supply source 531 via the rinsing liquid duct 532. The nozzle 51 also serves as a rinsing liquid ejector for ejecting a rinsing liquid sent out of the rinsing-liquid supply source 531 toward the upper face 91 of the substrate 9. The rinsing liquid may, for example, be a water-based processing liquid such as deionized water (DIW), carbonated water, ozone water, or hydrogen water.

As described above, the nozzle 51, the arm 511, and the nozzle rotation mechanism 512 are shared between the chemical-solution supply part 52 and the rinsing-liquid supply part 53. For example, the nozzle 51 may have a lower end provided individually with an ejection port for the chemical solution and an ejection port for the rinsing liquid so that a plurality of different types of processing liquids are supplied through different ducts and different ejection ports to the upper face 91 of the substrate 9. As another alternative, a nozzle for the chemical solution and a nozzle for the rinsing liquid may be provided separately.

The ultraviolet irradiator 7 includes an ultraviolet lamp 71 and a lamp elevating mechanism 72. The ultraviolet lamp 71 is a generally disk-shaped lamp arranged above the substrate 9. The lamp elevating mechanism 72 is arranged radially outward of the cup part 4. For example, the lamp elevating mechanism 72 may include an electric linear motor or may include a ball screw and an electrically rotating motor. The lamp elevating mechanism 72 is connected to the ultraviolet lamp 71 and moves the ultraviolet lamp 71 in the up-down direction. The ultraviolet lamp 71 is movable in the up-down direction between its retracted position indicated by the solid line in FIG. 1 and its irradiation position (indicated by a dashed double-dotted line) located below the retracted position. When the ultraviolet lamp 71 is moved from its retracted position to its irradiation position, the nozzle 51 is retracted from above the substrate 9 to its retracted position by the nozzle rotation mechanism 512. The ultraviolet lamp 71 at its irradiation position applies ultraviolet rays toward the entire upper face 91 of the substrate 9.

The ultraviolet lamp 71 may, for example, be an excimer lamp or a low pressure mercury lamp. The ultraviolet rays emitted from the ultraviolet lamp 71 preferably have wavelengths shorter than or equal to 250 nm and more preferably shorter than or equal to 172 nm. There are no particular limitations on the lower limit for the wavelengths of the ultraviolet rays, but the lower limit therefor may, for example, be 120 nm or longer.

Figure 3:
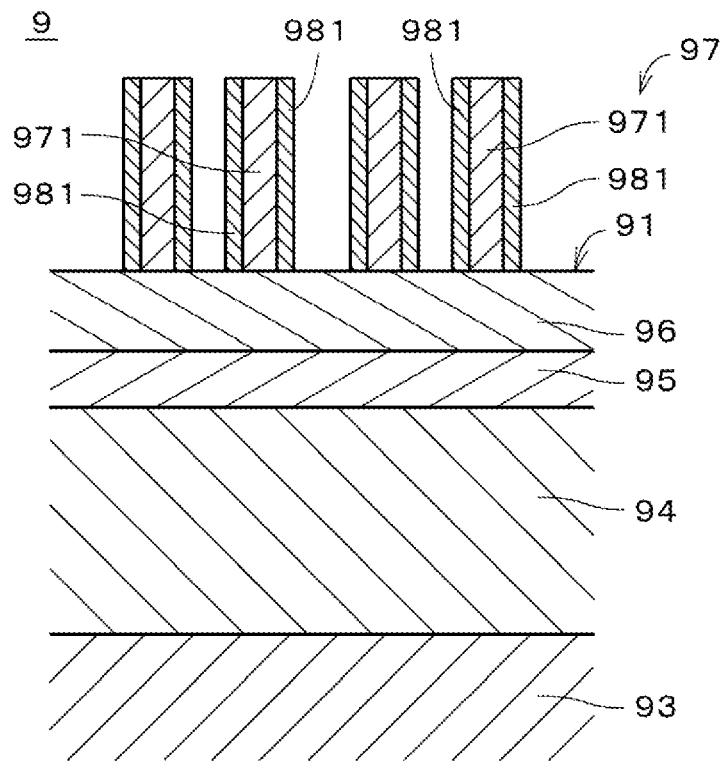
FIG. 3 is a cross-sectional view of a portion in the vicinity of the upper face of a substrate.

FIG. 3 is a cross-sectional view illustrating a portion in the vicinity of the upper face 91 of the substrate 9 in enlarged dimensions. The substrate 9 illustrated in FIG. 3 includes an insulation film 94 formed on the upper face of a silicon substrate main body 93, a titanium nitride (TiN) film 95 formed on the upper face of the insulation film 94, and a silicon nitride film 96 formed on the upper face of the titanium nitride film 95. The insulation film 94, the titanium nitride film 95, and the silicon nitride film 96 each have a generally uniform thickness on the entire upper face of the silicon substrate main body 93 illustrated in FIG. 3.

An amorphous silicon layer 97 is formed on an upper face of the silicon nitride film 96. The amorphous silicon layer 97 is a fine pattern including a group of pattern elements 971. The amorphous silicon layer 97 is an intermediate pattern formed in the course of multiple patterning of the substrate 9. Four of the pattern elements 971 are illustrated in FIG. 3. The pattern elements 971 in FIG. 3 have a width of, for example, 30 nm to 100 nm in the right-left direction. The pattern elements 971 have a height of, for example, 20 nm to 100 nm in the up-down direction. The upper face of the silicon nitride film 96 is exposed at the space between each pair of adjacent pattern elements 971.

Each pattern element 971 of the amorphous silicon layer 97 has side faces covered with sidewalls 981. The sidewalls 981 are thin films formed of, for example, a silicon oxide, a silicon nitride, or a silicon oxynitride. The sidewalls 981 in FIG. 3 have a smaller width in the right-left direction than the pattern elements 971, and this width may, for example, be in the range of 10 nm to 20 nm. The sidewalls 981 have approximately the same height in the up-down direction as the pattern elements 971, and the upper and lower ends of the sidewalls 981 are at approximately the same positions in the up-down direction as the upper and lower ends of the pattern elements 971. The upper face of each pattern element 971 is not covered with the aforementioned film formed of, for example, a silicon oxide, a silicon nitride, or a silicon oxynitride and is exposed from the two sidewalls 981 that cover both of the side faces of the pattern element 971.

Figure 4:
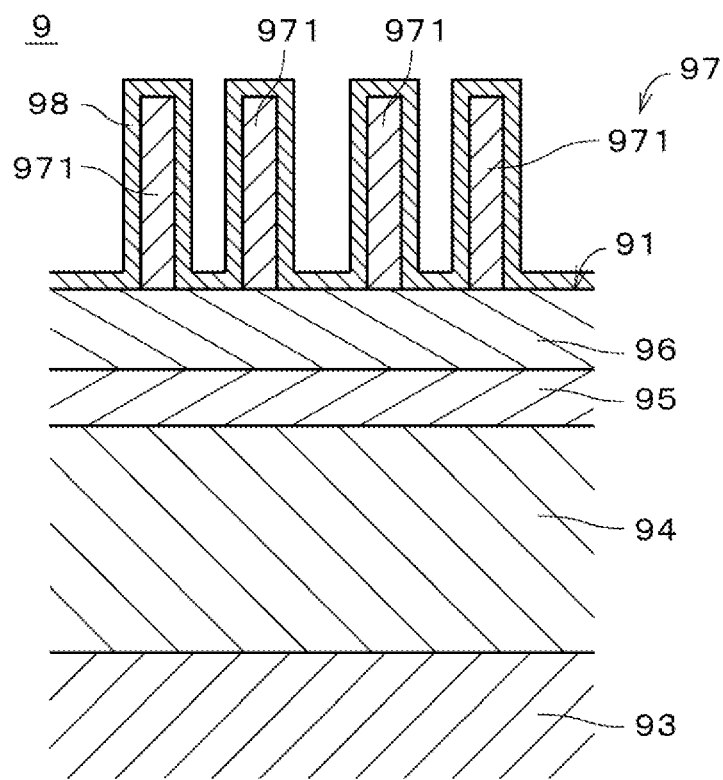
FIG. 4 is a cross-sectional view of the portion in the vicinity of the upper face of the substrate.

The substrate 9 illustrated in FIG. 3 is formed by an apparatus different from the substrate processing apparatus 1. Specifically, first, the insulation film 94, the titanium nitride film 95, the silicon nitride film 96, and the amorphous silicon layer 97 (i.e., the intermediate pattern) are formed in sequence on the silicon substrate main body 93, and a coating film 98 that covers the uppermost amorphous silicon layer 97 is formed as illustrated in FIG. 4. The coating film 98 may, for example, be a silicon oxide film, a silicon nitride film, or a silicon oxynitride film. The coating film 98 entirely covers the upper and side faces of each pattern element 971 of the amorphous silicon layer 97 and the upper face of the silicon nitride film 96 that is exposed at the spaces between each pair of adjacent pattern elements 971. The coating film 98 may be formed by, for example, chemical vapor deposition (CVD), physical vapor deposition (PVD), or atomic layer deposition (ALD).

Then, dry etching is performed on the coating film 98 illustrated in FIG. 4. The dry etching may, for example, be plasma etching with plasma generated from a fluorocarbon gas (CxFy) and an oxygen gas. The dry etching is substantially anisotropic etching in which etching substantially proceeds in only the up-down direction. The anisotropic etching on the coating film 98 exposes the upper face of each pattern element 971 of the amorphous silicon layer 97 from the coating film 98 and also exposes the upper face of the silicon nitride film 96 that is located between each pair of adjacent pattern elements 971 from the coating film 98. The side face of each pattern element 971 of the amorphous silicon layer 97 is kept covered with the coating film 98. In this way, the substrate 9 illustrated in FIG. 3 is formed. The sidewalls 981 that cover the side faces of each pattern element 971 is a portion of the aforementioned coating film 98 (see FIG. 4) that is left after the dry etching.

Figure 5:
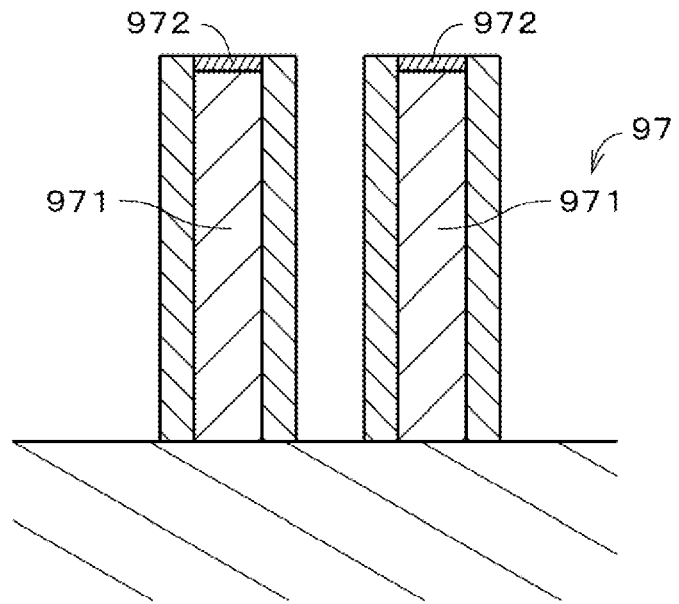
FIG. 5 is a cross-sectional view of the portion in the vicinity of the upper face of the substrate.

The substrate 9 has an altered layer 972 formed in the upper face of each pattern element 971 exposed from the coating film 98 as illustrated in FIG. 5, as a result of oxygen (O), carbon (C), fluorine (F), and other elements being introduced into the upper face of the pattern element 971 (i.e., the surface of the amorphous silicon layer 97 on the side opposite to the silicon substrate main body 93). In FIG. 5, the altered layer 972 is cross-hatched in a different manner from cross-hatching of portions of the pattern elements 971 other than the altered layer 972. The altered layer 972 derived from the dry etching in the upstream operation is considered to have an "Si—O bond" and an "Si—C bond" formed as a result of the silicon of the amorphous silicon layer 97 being bonded to the oxygen and carbon introduced into the amorphous silicon layer 97. Then, these Si—O and Si—C bonds are considered to be a cause of inhibiting wet etching (described later) on the amorphous silicon layer 97 in the substrate processing apparatus 1. Note that the altered layer 972 may only have either the Si—O bond or the Si—C bond.

Next, processing that is performed on the substrate 9 by the substrate processing apparatus 1 will be described with reference to FIG. 6. In the substrate processing apparatus 1, first, the substrate 9 including the amorphous silicon layer 97 and the sidewalls 981 illustrated in FIG. 3 is transported into the substrate processing apparatus 1 illustrated in FIG. 1 and held in a horizontal position by the substrate holder 31 (step S11). The amorphous silicon layer 97 has a surface on which the altered layer 972 derived from dry etching is formed as illustrated in FIG. 5.

Then, the ultraviolet irradiator 7 is controlled by the irradiation controller 62 such that the ultraviolet lamp 71 is arranged at the irradiation position indicated by the dashed double-dotted line in FIG. 1 and emits ultraviolet rays toward the entire upper face 91 of the substrate 9. Accordingly, the altered layer 972 of the amorphous silicon layer 97 is irradiated with the ultraviolet rays. The application of the ultraviolet rays from the ultraviolet lamp 71 to the altered layer 972 is conducted for a predetermined period of time. This breaks the Si—O and Si—C bonds in the altered layer 972. As a result, the altered layer 972 is reformed into a reformed layer (step S12).

In step S12, the ultraviolet rays applied to the amorphous silicon layer 97 preferably have wavelengths shorter than or equal to 250 nm as described above. The ultraviolet rays with wavelengths shorter than or equal to 250 nm have energies higher than or equal to 478 kJ/mol, and these energies are higher than a bond energy of 443 kJ/mol of the Si—O bond and a bond energy of 337 kJ/mol of the Si—C bond. Thus, the irradiation of the altered layer 972 with the ultraviolet rays having wavelengths shorter than or equal to 250 nm enables favorably breaking the Si—O and Si—C bonds in the altered layer 972.

In step S12, a cumulative amount of irradiation with the ultraviolet rays applied from the ultraviolet lamp 71 to the amorphous silicon layer 97 is preferably greater than or equal to 1000 mJ/cm$^2$. There are no particular limitations on the upper limit for the cumulative amount of irradiation, but the upper limit therefore may, for example, be 3000 mJ/cm$^2$. The cumulative amount of irradiation is obtained by integrating the illuminance (mW/cm$^2$) of the ultraviolet rays on the upper face of the amorphous silicon layer 97 with the time (sec) of irradiation with the ultraviolet rays.

The irradiation of the amorphous silicon layer 97 with the ultraviolet rays in step S12 is preferably conducted in a low oxygen atmosphere. More preferably, the irradiation with the ultraviolet rays is conducted in an atmosphere having an oxygen concentration of 1% by volume or lower. The low oxygen atmosphere may be realized by various methods. For example, the aforementioned low oxygen atmosphere may be realized by supplying an inert gas such as a nitrogen (N$_2$) gas from the airflow generator 12 to the inner space of the housing 11 and placing the internal space of the housing 11 in an inert gas atmosphere. The supply of the inert gas to the housing 11 may be implemented by a gas supply mechanism other than the airflow generator 12. As another alternative, the inert gas may be supplied to only the space between the ultraviolet lamp 71 and the substrate 9 from, for example, one side of this space in order to conduct the aforementioned irradiation with the ultraviolet rays in an low oxygen atmosphere.

When the ultraviolet irradiation of the amorphous silicon layer 97 is completed, the ultraviolet lamp 71 is moved from the aforementioned irradiation position to its retracted position by the lamp elevating mechanism 72. The nozzle 51 is also moved from its retracted position to its position above the substrate 9 by the nozzle rotation mechanism 512. Then, rotation of the substrate 9 is started by the substrate rotation mechanism 33, and the chemical-solution supply part 52 is controlled by the supply controller 63 such that a chemical solution is supplied from the nozzle 51 to the rotating substrate 9. Specifically, a liquid column-like chemical solution is ejected from the nozzle 51 toward the central portion of the upper face 91 of the substrate 9. The chemical solution supplied to the surface of the substrate 9 is spread radially outward from the central portion of the substrate 9 by the centrifugal force and given to the entire upper face 91 of the substrate 9.

The chemical solution is an etchant such as an ammonium hydroxide aqueous solution, and when the chemical solution is supplied to the amorphous silicon layer 97 with the aforementioned reformed layer on the surface, wet etching is performed on the amorphous silicon layer 97 (step S13). On the substrate 9, each pattern element 971 of the amorphous silicon layer 97 is selectively etched and removed, whereas the sidewalls 981 that cover the side faces of each pattern element 971 are not etched and left on the silicon nitride film 96.

In the substrate processing apparatus 1, during the wet etching on the amorphous silicon layer 97, the nozzle rotation mechanism 512 may be driven by the supply controller 63 so as to reciprocally move the nozzle 51 in a generally radial direction above the substrate 9. This improves uniformity in the application of the etchant to the entire surface of the substrate 9.

Figure 7:
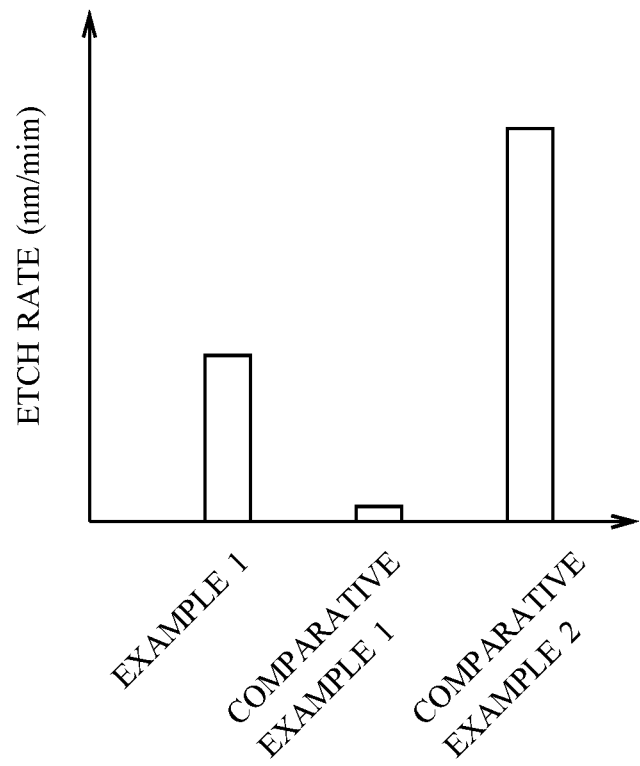
FIG. 7 is an illustration of an etch rate of an amorphous silicon layer.

FIG. 7 is an illustration of the etch rate of the amorphous silicon layer 97 during the aforementioned wet etching. The etch rate is obtained using, as the etchant, an ammonium hydroxide aqueous solution prepared by mixing ammonium hydroxide and DIW at a ratio of 1:15. In the drawing, Example 1 shows the etch rate of an amorphous silicon layer 97 with the aforementioned reformed layer formed on the surface. In Example 1, the cumulative amount of irradiation of the altered layer 972 with the ultraviolet rays in step S12 described above was 1000 mJ/cm$^2$. Comparative Example 1 shows the etch rate of an amorphous silicon layer 97 with the altered layer 972 formed on the surface (i.e., the amorphous silicon layer before the ultraviolet irradiation). Comparative Example 2 shows the etch rate of an amorphous silicon layer 97 with neither the altered layer 972 nor the reformed layer formed on the surface (i.e., the amorphous silicon layer that has not undergone plasma etching).

As illustrated in FIG. 7, the etch rate according to Comparative Example 1 is extremely low and approximately 3% of the etch rate according to Comparative Example 2 because the wet etching is inhibited by the altered layer 972. Thus, in Comparative Example 1, the wet etching on the amorphous silicon layer 97 is substantially not performed. On the other hand, the etch rate according to Example 1 is recovered to approximately 43% of the etch rate according to Comparative Example 2 because the altered layer 972 is reformed with the ultraviolet irradiation. This enables favorably performing the wet etching on the amorphous silicon layer 97. Note that the etch rate according to Example 1 is 10 time or more the etch rate according to Comparative Example 1.

In the substrate processing apparatus 1, the supply of the chemical solution (i.e., etchant) from the nozzle 51 continues for a predetermined period of time. As a result, all of the pattern elements 971 of the amorphous silicon layer 97 are removed from the spaces between the sidewalls 981, and the wet etching on the substrate 9 is completed.

When the wet etching is completed, the rinsing-liquid supply part 53 is controlled by the supply controller 63 such that a rinsing liquid is supplied from the nozzle 51 to the upper face 91 of the rotating substrate 9 to perform rinsing processing on the substrate 9 (step S14). Thereafter, the supply of the rinsing liquid is stopped, and dry processing is performed on the substrate 9 (step S15). In the dry processing, the rotation speed of the substrate 9 is increased. As a result, the processing liquids remaining on the substrate 9 are scattered radially outward from the edge of the substrate 9 by the centrifugal force and removed from above the substrate 9. The processing liquids such as the chemical solution and the rinsing liquid, which are scattered radially outward from above the substrate 9 in steps S13 to S15 described above, are received by the cup part 4 and discharged to the outside of the housing 11. The substrate 9 that has undergone the dry processing is transported out of the substrate processing apparatus 1 into a different apparatus that performs downstream operations. The different apparatus performs, for example, dry etching on the silicon nitride film 96, using the sidewalls 981 as masks. In the substrate processing apparatus 1, the processing in steps S11 to S15 described above is performed in sequence on a plurality of substrates 9.

As described above, the above-described substrate processing method includes the operation for holding the substrate 9 in a horizontal positon, the substrate 9 including the amorphous silicon layer 97 on which the altered layer 972 derived from dry etching is formed (step S11), the operation for irradiating the altered layer 972 with ultraviolet rays to reform the altered layer 972 into a reformed layer (step S12), and the operation for supplying a chemical solution to the amorphous silicon layer 97 having the reformed layer on the surface to perform wet etching on the amorphous silicon layer 97 (step S13).

This increases the etch rate of the amorphous silicon layer 97 that has dropped due to the altered layer 972. As a result, it is possible to efficiently perform the wet etching on the amorphous silicon layer 97.

The aforementioned dry etching preferably includes etching the coating film 98 formed on the surface of the amorphous silicon layer 97 with plasma generated from a fluorocarbon gas and an oxygen gas. The above-described substrate processing method can increase the etch rate of the amorphous silicon layer 97 that has dropped due to the Si—O and Si—C bonds in the altered layer 972, because the ultraviolet irradiation of the amorphous silicon layer 97 breaks the Si—O and Si—C bonds.

As described above, the amorphous silicon layer 97 is preferably an intermediate pattern formed in the course of multiple patterning of the substrate 9. The above-described dry etching includes anisotropically etching the coating film 98 that covers the upper and side faces of the intermediate pattern so as to expose the upper face of the intermediate pattern from the coating film 98 and to form the sidewalls 981 of the coating film 98 that cover the side faces of the intermediate pattern. The above-described wet etching removes the intermediate pattern while leaving the sidewalls 981. The above-described substrate processing method can increase the etch rate of the amorphous silicon layer 97 through the ultraviolet irradiation of the altered layer 972, thereby making it possible to efficiently perform the aforementioned multiple patterning of the substrate 9.

As described above, the ultraviolet rays applied to the altered layer 972 in the step S12 preferably have wavelengths shorter than or equal to 250 nm. The ultraviolet rays with wavelengths shorter than or equal to 250 nm have energies higher than the bond energies of the Si—O and Si—C bonds. This enables favorably reforming the altered layer 972 with the ultraviolet irradiation (i.e., breaks in the Si—O and Si—C bonds in the altered layer 972).

As described above, the cumulative amount of irradiation with the ultraviolet rays in step S12 is preferably greater than or equal to 1000 mJ/cm$^2$. This enables favorably reforming the altered layer 972 with the ultraviolet irradiation.

As described above, the irradiation with the ultraviolet rays in step S12 is preferably conducted in a low oxygen atmosphere. This prevents or suppresses the ultraviolet rays that are being applied to the amorphous silicon layer 97 from being absorbed by oxygen. As a result, it is possible to efficiently reform the altered layer 972 with the ultraviolet irradiation.

The above-described substrate processing apparatus 1 includes the substrate holder 31, the ultraviolet irradiator 7, and the chemical-solution supply part 52. The substrate holder 31 holds the substrate 9 in a horizontal position, the substrate including the amorphous silicon layer 97 on which the altered layer 972 derived from dry etching is formed. The ultraviolet irradiator 7 irradiates the altered layer 972 with ultraviolet rays so as to reform the altered layer 972 into a reformed layer. The chemical-solution supply part 52 supplies a chemical solution to the amorphous silicon layer 97 having the reformed layer formed on the surface so as to perform wet etching on the amorphous silicon layer 97. This increases the etch rate of the amorphous silicon layer 97 that has dropped due to the altered layer 972, in the same manner as described above. As a result, it is possible to efficiently perform the wet etching on the amorphous silicon layer 97.

Figure 8:
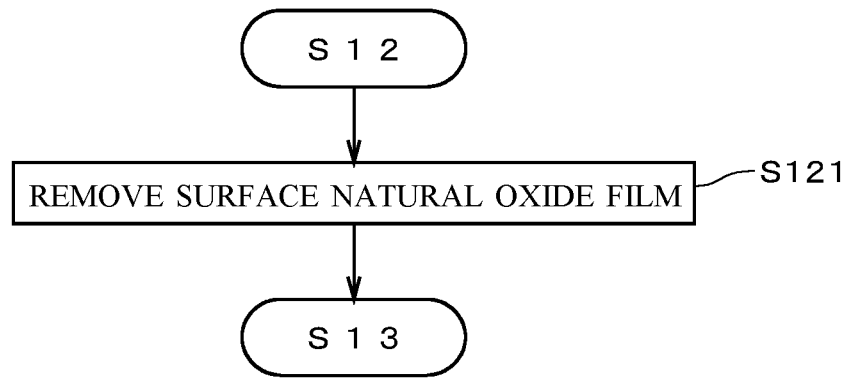
FIG. 8 is an illustration of part of the substrate processing procedure.

The processing performed on the substrate 9 by the substrate processing apparatus 1 may include an upstream operation performed on the amorphous silicon layer 97 (step S121) as illustrated in FIG. 8 between the irradiation of the amorphous silicon layer 97 with the ultraviolet rays in step S12 and the supply of the chemical solution (i.e., etchant) to the amorphous silicon layer 97 in step S13. In step S121, a different chemical solution (e.g., hydrofluoric acid (HF)) other than the chemical solution in step S13 is supplied to the amorphous silicon layer 97 so as to remove a surface natural oxide film from the surface of the amorphous silicon layer 97 (i.e., the upper face of the altered layer 972).

Figure 9:
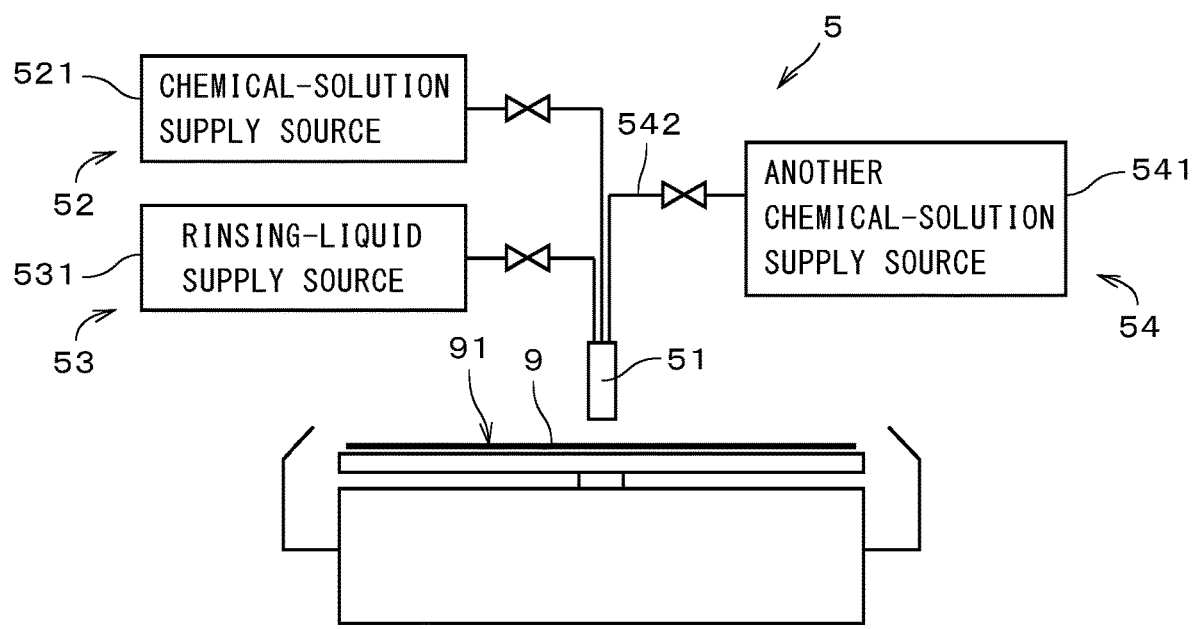
FIG. 9 is a block diagram of a processing-liquid supply part.

In this case, the processing-liquid supply part 5 of the substrate processing apparatus 1 further includes, in addition to the chemical-solution supply part 52 and the rinsing-liquid supply part 53, another chemical-solution supply part 54 that supplies the different chemical solution to the substrate 9 as illustrated in FIG. 9. The other chemical-solution supply part 54 includes the nozzle 51, the arm 511 (see FIG. 1), the nozzle rotation mechanism 512 (see FIG. 1), another chemical-solution supply source 541, and another chemical solution duct 542. The nozzle 51 is connected to the other chemical-solution supply source 541 via the other chemical solution duct 542. The nozzle 51 also serves as another chemical solution ejector that ejects the aforementioned different chemical solution (e.g., dilute hydrofluoric acid with a concentration of 0.3% at atmospheric temperatures) that is sent out from the other chemical-solution supply source 541, toward the upper face 91 of the substrate 9. Note that the nozzle for ejecting the different chemical solution may be provided separately from the aforementioned nozzle for ejecting the etchant.

As described above, the above-described substrate processing method preferably further includes, between steps S12 and S13, the operation for removing the surface natural oxide film from the amorphous silicon layer 97 by supplying a different chemical solution to the amorphous silicon layer 97 (step S121). In this way, the removal of the surface natural oxide film before the wet etching on the amorphous silicon layer 97 prevents or suppresses the occurrence of a drop in etch rate caused by the surface natural oxide film. As a result, it is possible to more efficiently perform the wet etching on the amorphous silicon layer 97.

Figure 10:
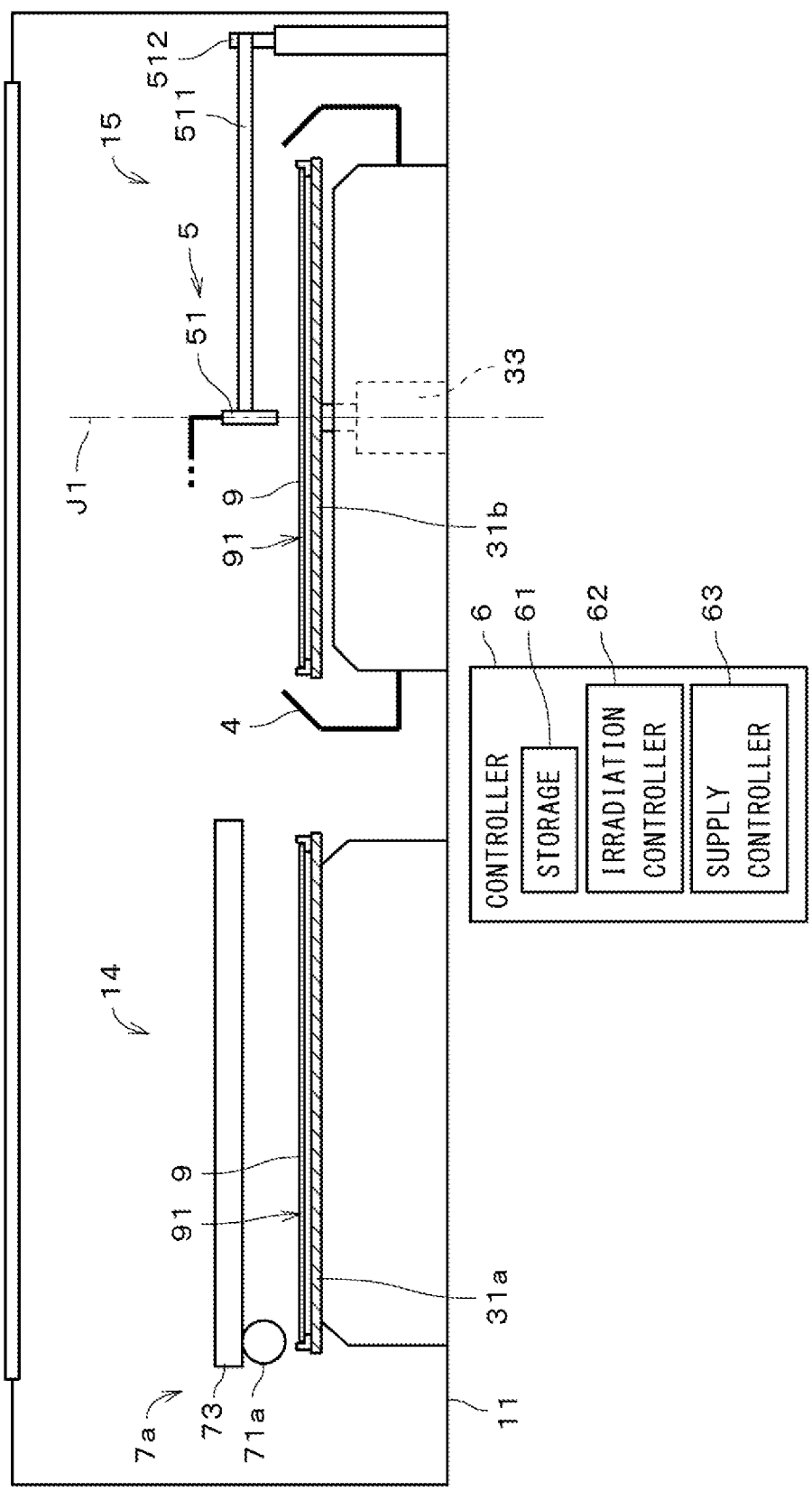
FIG. 10 is a side view of a substrate processing apparatus according to a second embodiment.

Next is a description of a substrate processing apparatus 1a according to a second embodiment of the present invention. FIG. 10 is a side view illustrating a configuration of the substrate processing apparatus 1a. The substrate processing apparatus 1a performs processing that is approximately the same as the processing performed on the substrate 9 illustrated in FIG. 3 by the substrate processing apparatus 1 illustrated in FIG. 1 so as to perform wet etching on the amorphous silicon layer 97.

The substrate processing apparatus 1a includes an irradiation unit 14, a liquid processing unit 15, a controller 6, and a housing 11. The irradiation unit 14 and the liquid processing unit 15 are arranged inside the single housing 11. The controller 6 has a structure similar to the structure of the controller 6 illustrated in FIG. 1. As described above, the controller 6 includes a storage 61, an irradiation controller 62, and a supply controller 63.

The irradiation unit 14 includes a first substrate holder 31a and a ultraviolet irradiator 7a. The first substrate holder 31a has a structure approximately the same as the structure of the substrate holder 31 illustrated in FIG. 1 and holds a substrate 9 in a horizontal position from the underside. In the example illustrated in FIG. 10, the irradiation unit 14 does not include the substrate rotation mechanism 33, and therefore the first substrate holder 31*a* does not rotate.

The ultraviolet irradiator 7*a* includes an ultraviolet lamp 71*a* and an irradiation-region scanner 73. The ultraviolet lamp 71*a* is a generally rod-like lamp that extends approximately in a straight line in a direction perpendicular to the plane of the drawing. The ultraviolet rays emitted from the ultraviolet lamp 71*a* are applied to a band-like or linear irradiation region that extends approximately in a straight line in the direction perpendicular to the plane of the drawing on the substrate 9. The irradiation region is part of the upper face 91 of the substrate 9 and traverses the upper face 91 of the substrate 9 in the direction perpendicular to the plane of the drawing. Like the aforementioned ultraviolet lamp 71, the ultraviolet lamp 71*a* may, for example, be an excimer lamp or a low pressure mercury lamp. The ultraviolet rays emitted from the ultraviolet lamp 71*a* preferably have wavelengths shorter than or equal to 250 nm and more preferably shorter than or equal to 172 nm. There are no particular limitations on the lower limit for the wavelengths of the ultraviolet rays, but the lower limit therefor may, for example, be 120 nm or longer.

The irradiation-region scanner 73 moves the ultraviolet lamp 71*a* in the right-left direction in the drawing above the substrate 9 so as to scan the irradiation region on the substrate 9 in the right-left direction in the drawing. For example, the irradiation-region scanner 73 may include an electric linear motor or may include a ball screw and an electrically rotating motor. In the substrate processing apparatus 1*a*, the irradiation controller 62 of the controller 6 controls the irradiation-region scanner 73 so as to control the moving speed of the ultraviolet lamp 71*a* and to control the scanning speed of scanning the irradiation region irradiated with the ultraviolet rays on the substrate 9. Note that, while the ultraviolet lamp 71*a* is moving, outputs from the ultraviolet lamp 71*a* are maintained approximately constant.

The liquid processing unit 15 has a structure approximately the same as the structure of the substrate processing apparatus 1 illustrated in FIG. 1, except that the ultraviolet irradiator 7 is omitted and that the liquid processing unit 15 includes a second substrate holder 31*b* having a structure similar to the structure of the substrate holder 31. In the following description, constituent elements of the liquid processing unit 15 that correspond to those of the substrate processing apparatus 1 are given the same reference signs. In the substrate processing apparatus 1*a*, the first substrate holder 31*a* and the second substrate holder 31*b* configure the substrate holder 31 that holds the substrate 9 in a horizontal position.

In the liquid processing unit 15, when a chemical solution (i.e., etchant) is ejected from the nozzle 51 to the upper face 91 of the substrate 9, the nozzle rotation mechanism 512 reciprocally moves the nozzle 51 in an approximately radial direction above the substrate 9. Accordingly, a position at which the chemical solution is ejected on the upper face 91 of the substrate 9 is scanned. In other words, the nozzle rotation mechanism 512 serves as an ejection-position scanner that scans the chemical-solution ejection position on the upper face 91 of the substrate 9. In the substrate processing apparatus 1*a*, the supply controller 63 of the controller 6 controls the nozzle rotation mechanism 512 so as to control the moving speed of the nozzle 51 and to control the scanning speed of scanning the chemical-solution ejection position on the substrate 9.

Figure 6:
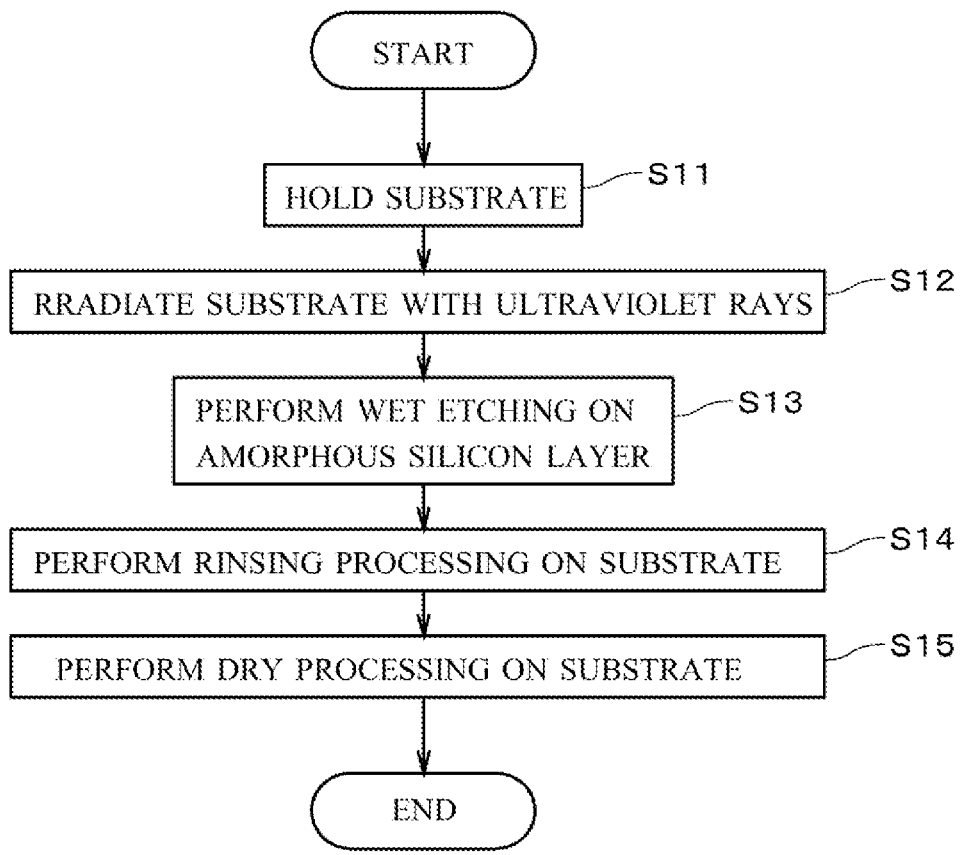
FIG. 6 shows an example of a substrate processing procedure.

A procedure for processing the substrate 9 in the substrate processing apparatus 1*a* is approximately the same as the procedure in steps S11 to S15 illustrated in FIG. 6. In the processing performed on the substrate 9 by the substrate processing apparatus 1*a*, first, the substrate 9 including the amorphous silicon layer 97 and the sidewalls 981 illustrated in FIG. 3 is transported into the substrate processing apparatus 1*a* and held in a horizontal position by the first substrate holder 31*a* of the irradiation unit 14 (step S11). As described above, the amorphous silicon layer 97 has a surface on which the altered layer 972 (see FIG. 5) derived from dry etching is formed.

Then, the irradiation controller 62 controls the ultraviolet irradiator 7*a* of the irradiation unit 14 so as to irradiate the altered layer 972 of the amorphous silicon layer 97 with ultraviolet rays. Specifically, the ultraviolet rays are emitted from the ultraviolet lamp 71*a* and irradiates an irradiation region that extends approximately in a straight line on the upper face 91 of the substrate 9. Then, the irradiation-region scanner 73 scans the ultraviolet lamp 71*a* from the left side to the right side in the drawing above the substrate 9 so that the ultraviolet rays are applied to the entire upper face 91 of the substrate 9. This breaks the Si-O and Si-C bonds in the altered layer 972 and reforms the altered layer 972 into the aforementioned reformed layer (step S12).

In step S12, the ultraviolet rays applied to the amorphous silicon layer 97 preferably have wavelengths shorter than or equal to 250 nm. This enables favorably reforming the altered layer 972 with the ultraviolet irradiation (i.e., breaks in the Si—O and Si—C bonds in the altered layer 972). In step S12, the cumulative amount of irradiation with the ultraviolet rays applied from the ultraviolet lamp 71*a* to the altered layer 972 of the amorphous silicon layer 97 is preferably greater than or equal to 1000 mJ/cm$^2$ as described above. This enables favorably reforming the altered layer 972 with the ultraviolet irradiation.

The irradiation of the amorphous silicon layer 97 with the ultraviolet rays in step S12 is preferably conducted in a low oxygen atmosphere. This prevents or suppresses the ultraviolet rays that are being applied to the amorphous silicon layer 97 from being absorbed by oxygen as described above. As a result, it is possible to efficiency reform the altered layer 972 with the ultraviolet irradiation. Note that, in step S12, the substrate 9 may be scanned a plurality of times with the ultraviolet rays by reciprocally moving the ultraviolet lamp 71*a* in the right-left direction above the substrate 9.

When step S12 is completed, the substrate 9 is transported from the irradiation unit 14 to the liquid processing unit 15 by a transport mechanism such as a robot hand not shown, and is held in a horizontal position by the second substrate holder 31*b* of the liquid processing unit 15. Then, rotation of the substrate 9 is started by the substrate rotation mechanism 33, and the chemical-solution supply part 52 (see FIG. 2) is controlled by the supply controller 63 to supply a chemical solution (i.e., etchant) from the nozzle 51 to the rotating substrate 9. As described above, the nozzle 51 is reciprocally moved approximately in a radial direction above the substrate 9 by the nozzle rotation mechanism 512 in order to scan the chemical-solution ejection position on the upper face 91 of the substrate 9. Then, another chemical solution is supplied to the amorphous silicon layer 97 having the aforementioned reformed layer formed on the surface to perform wet etching on the amorphous silicon layer 97 (step S13).

When the wet etching is completed, a rinsing liquid is supplied from the nozzle 51 to the upper face 91 of the rotating substrate 9 to perform rinsing processing on the substrate 9 (step S14). Thereafter, the supply of the rinsing liquid is stopped, and dry processing is performed on the substrate 9 (step S15). In the substrate processing apparatus 1a, the processing in steps S11 to S15 described above is performed in sequence on a plurality of substrates 9. Note that the substrate processing apparatus 1a may also perform step S121 described above (see FIG. 8) between steps S12 and S13.

Like the substrate processing apparatus 1 illustrated in FIG. 1, the substrate processing apparatus 1a can increase the etch rate of the amorphous silicon layer 97 that has dropped due to the altered layer 972. Specifically, the etch rate of the amorphous silicon layer 97 can be increased by breaking the Si—O and Si—C bonds in the altered layer 972. This enables efficiently performing the wet etching on the amorphous silicon layer 97. As a result, it is possible to efficiently perform the aforementioned multiple patterning of the substrate 9.

As described above, the substrate processing apparatus 1a scans the irradiation region irradiated with the ultraviolet rays on the substrate 9 in step S12. At this time, the irradiation-region scanner 73 is preferably controlled by the irradiation controller 62 such that a region of the amorphous silicon layer 97 in which the altered layer 972 has a large thickness has a lower scanning speed of scanning the irradiation region irradiated with the ultraviolet rays than a region of the amorphous silicon layer 97 in which the altered layer 972 has a small thickness. Accordingly, the region of the amorphous silicon layer 97 in which the altered layer 972 has a large thickness has a greater cumulative amount of irradiation with the ultraviolet rays than the region of the amorphous silicon layer 97 in which the altered layer 972 has a small thickness. As a result, it is possible to improve uniformity in reforming the altered layer 972 of the amorphous silicon layer 97 as a whole. Note that the improvement of uniformity in reforming may be checked from the improvement of uniformity in the etch rate of the amorphous silicon layer 97 as a whole.

In the substrate processing apparatus 1a, outputs of the ultraviolet lamp 71a may be controlled by the irradiation controller 62 such that the region where the altered layer 972 has a large thickness is irradiated with ultraviolet rays with higher illuminance than the region where the altered layer 972 has a small thickens. In this case, the cumulative amount of irradiation with the ultraviolet rays in the region of the amorphous silicon layer 97 in which the altered layer 972 has a large thickness can be made greater than the cumulative amount of irradiation with the ultraviolet rays in the region of the amorphous silicon layer 97 in which the altered layer 972 has a small thickness, while keeping constant the scanning speed of scanning the irradiation region irradiated with the ultraviolet rays. As a result, it is possible as described above to improve uniformity in reforming the altered layer 972 of the amorphous silicon layer 97 as a whole.

As described above, the substrate processing apparatus 1a scans the ejection position at which the chemical solution is ejected on the substrate 9 in step S13. At this time, the nozzle rotation mechanism 512 (i.e., ejection-position scanner) is preferably controlled by the supply controller 63 so that the region of the amorphous silicon layer 97 in which the altered layer 972 has a large thickness has a lower scanning speed of scanning the chemical-solution ejection position than the region of the amorphous silicon layer 97 in which the altered layer 972 has a small thickness. Accordingly, in the amorphous silicon layer 97, the region where the altered layer 972 has a large thickness has a longer time of ejection of the chemical solution than the region where the altered layer 972 has a small thickness. As a result, it is possible to improve uniformity in the wet etching on the amorphous silicon layer 97 as a whole (i.e., uniformity in the speed of advance of the wet etching).

The substrate processing method and the substrate processing apparatuses 1 and 1a described above may be modified in various ways.

For example, the ultraviolet irradiation of the amorphous silicon layer 97 in step S12 does not necessarily have to be conducted in a low oxygen atmosphere, and may be conducted in an ambient atmosphere, for example.

In step S12, the cumulative amount of irradiation of the amorphous silicon layer 97 with the ultraviolet rays may be appropriately changed according to, for example, the type and thickness of the altered layer 972. For example, the cumulative amount of irradiation of the amorphous silicon layer 97 with the ultraviolet rays may be less than 1000 mJ/cm$^2$.

In step S12, the wavelength of the ultraviolet rays applied to the amorphous silicon layer 97 may also be appropriately changed according to, for example, the type and thickness of the altered layer 972. For example, the wavelengths of the ultraviolet rays applied to the amorphous silicon layer 97 may be 250 nm or longer.

The amorphous silicon layer 97 of the substrate 9 that is processed by the substrate processing apparatus 1 or 1a does not necessarily have to be an intermediate pattern formed in the course of multiple patterning of the substrate 9, and may be an amorphous silicon layer that has undergone processing other than multiple patterning.

The altered layer 972 reformed by the substrate processing apparatus 1 or 1a does not necessarily have to be formed during plasma etching with plasma generated from a fluorocarbon gas and an oxygen gas, and may be formed as a result of alternation of the surface of the amorphous silicon layer 97 through different processing.

In the substrate processing apparatus 1, the irradiation of the amorphous silicon layer 97 with the ultraviolet rays may be implemented by the ultraviolet irradiator 7a illustrated in FIG. 10. In the substrate processing apparatus 1a, the irradiation of the amorphous silicon layer 97 with the ultraviolet rays may be implemented by the ultraviolet irradiator 7 illustrated in FIG. 1. In the substrate processing apparatus 1a, the irradiation unit 14 and the liquid processing unit 15 may be housed in different housings.

The above-described substrate processing apparatus 1 may be used to process glass substrates for use in flat panel displays such as liquid crystal displays and organic electroluminescence (EL) displays, instead of semiconductor substrates, or for use in other displays. As another alternative, the above-described substrate processing apparatus 1 may be used to process other substrates such as optical disk substrates, magnetic disk substrates, magneto-optical disk substrates, photomask substrates, ceramic substrates, and solar-cell substrates.

The configurations of the above-described preferred embodiments and variations may be appropriately combined as long as there are no mutual inconsistencies.

While the invention has been shown and described in detail, the foregoing description is in all aspects illustrative and not restrictive. It is therefore to be understood that numerous modifications and variations can be devised without departing from the scope of the invention.

REFERENCE SIGNS LIST

1, 1a Substrate processing apparatus
7, 7a Ultraviolet irradiator

9 Substrate
31 Substrate holder
31a First substrate holder
31b Second substrate holder
51 Nozzle
52 Chemical-solution supply part
54 Another chemical-solution supply part
62 Irradiation controller
63 Supply controller
71, 71a Ultraviolet lamp
73 Irradiation-region scanner
97 Amorphous silicon layer
98 Coating film
512 Nozzle rotation mechanism
972 Reformed layer
981 Sidewall
S11 to S15 Step

The invention claimed is:

1. A substrate processing method comprising:
   a) holding a substrate in a horizontal position, said substrate including an amorphous silicon layer having a surface on which an altered layer derived from dry etching is formed;
   b) irradiating said altered layer with an ultraviolet ray to reform said altered layer into a reformed layer; and
   c) supplying a chemical solution to said amorphous silicon layer having said reformed layer on the surface to perform wet etching on said amorphous silicon layer.

2. The substrate processing method according to claim 1, wherein said dry etching includes etching a coating film formed on the surface of said amorphous silicon layer, using plasma generated from a fluorocarbon gas and an oxygen gas.

3. The substrate processing method according to claim 2, wherein
   said amorphous silicon layer is an intermediate pattern formed in a course of multiple patterning of said substrate,
   said dry etching includes anisotropically etching said coating film that covers upper and side faces of said intermediate pattern to expose said upper face of said intermediate pattern from said coating film and to form a sidewall of said coating film that covers said side face of said intermediate pattern, and said wet etching removes said intermediate pattern while leaving said sidewall.

4. The substrate processing method according to claim 1, wherein said ultraviolet ray has a wavelength shorter than or equal to 250 nm.

5. The substrate processing method according to 1 claim 1, wherein in said operation b), a cumulative amount of irradiation with said ultraviolet ray is greater than or equal to 1000 mJ/cm$^2$.

6. The substrate processing method according to claim 1, wherein
   the irradiation with said ultraviolet ray in said operation b) is conducted in a low oxygen atmosphere.

7. The substrate processing method according to claim 1, wherein
   said operation b) includes scanning a region of the surface of said substrate that is irradiated with said ultraviolet ray, and
   in said amorphous silicon layer, a region where said altered layer has a large thickness has a greater cumulative amount of irradiation with said ultraviolet ray than a region where said altered layer has a small thickness.

8. The substrate processing method according to claim 1, wherein
   said operation c) includes scanning a position of ejection of said chemical solution on said substrate, and
   in said amorphous silicon layer, a region where said reformed layer has a large thickness has a longer time of ejection of said chemical solution than a region where said reformed layer has a small thickness.

9. The substrate processing method according to claim 1, further comprising:
   between said operation b) and said operation c), supplying another chemical solution to said amorphous silicon layer to remove a surface natural oxide film from said amorphous silicon layer.

* * * * *